United States Patent
Durney et al.

(10) Patent No.: US 7,354,639 B2
(45) Date of Patent: Apr. 8, 2008

(54) METHOD OF BENDING SHEET MATERIALS AND SHEET THEREFOR

(75) Inventors: Max W. Durney, San Francisco, CA (US); Alan D. Pendley, Petaluma, CA (US)

(73) Assignee: Industrial Origami, Inc., San Francisco, CA (US)

( * ) Notice: Subject to any disclaimer, the term of this patent is extended or adjusted under 35 U.S.C. 154(b) by 102 days.

(21) Appl. No.: 11/016,408

(22) Filed: Dec. 16, 2004

(65) Prior Publication Data

US 2006/0130551 A1    Jun. 22, 2006

(51) Int. Cl.
*B32B 3/24* (2006.01)
*B21D 28/26* (2006.01)

(52) U.S. Cl. .......... 428/136; 428/122; 428/43; 428/130; 493/352; 493/363; 52/674; 52/673; 52/675

(58) Field of Classification Search ............ 428/122, 428/43, 130, 136; 493/352, 363; 52/674, 52/673, 675
See application file for complete search history.

(56) References Cited

U.S. PATENT DOCUMENTS

| 975,121 | A | 11/1910 | Carter |
|---|---|---|---|
| 1,295,769 | A | 2/1919 | Kux |
| 1,405,042 | A | 1/1922 | Kraft |
| 1,698,891 | A | 1/1929 | Overbury |
| 2,127,618 | A | 8/1938 | Riemenschneider |
| 2,560,786 | A | 7/1951 | Wright et al. |
| 3,258,380 | A | 6/1966 | Fischer et al. |
| 3,341,395 | A | 9/1967 | Weber |
| 3,353,639 | A | 11/1967 | Andriussi |
| 3,756,499 | A | 9/1973 | Giebel et al. |
| 3,788,934 | A | 1/1974 | Coppa |
| 3,854,859 | A | 12/1974 | Sola |
| 3,938,657 | A | 2/1976 | David |
| 3,963,170 | A | 6/1976 | Wood |

(Continued)

FOREIGN PATENT DOCUMENTS

DE    298 18 909 U1    2/1999

(Continued)

OTHER PUBLICATIONS

Patent Abstracts of Japan, vol. 004, No. 053 (M-008), Apr. 19, 1980 (JP 55-022468 A).

(Continued)

*Primary Examiner*—William P Watkins, III
(74) *Attorney, Agent, or Firm*—Morgan, Lewis & Bockius LLP; David J. Brezner; Victor E. Johnson

(57) ABSTRACT

A sheet of material formed for bending along a bend line including a sheet of material (30) includes a plurality of dividing slits (37) and a plurality of strap slits (39) formed therethrough. The dividing slits extending substantially along a desired bend line (35) and divide the sheet of material into first and second planar regions (32, 33). The strap slits intersect the desired bend line and adjacent pairs of strap slits form a bending strap therebetween. The bending strap has a longitudinal strap axis intersecting the desired bend line. The sheet of material may be formed of composite materials. A method of forming and using the sheet of material is also disclosed.

22 Claims, 5 Drawing Sheets

U.S. PATENT DOCUMENTS

| | | |
|---|---|---|
| 4,215,194 A | 7/1980 | Sheperd |
| 4,289,290 A | 9/1981 | Miller |
| 4,559,259 A | 12/1985 | Cetrelli |
| 4,628,661 A | 12/1986 | St. Louis |
| 4,837,066 A | 6/1989 | Quinn et al. |
| 5,148,900 A | 9/1992 | Mohan |
| 5,157,852 A | 10/1992 | Patrou et al. |
| 5,225,799 A | 7/1993 | West et al. |
| 5,239,741 A | 8/1993 | Shamos |
| 5,390,782 A | 2/1995 | Sinn |
| 5,524,396 A | 6/1996 | Lalvani |
| 5,568,680 A | 10/1996 | Parker |
| 5,692,672 A | 12/1997 | Hunt |
| 5,701,780 A | 12/1997 | Ver Meer |
| 5,709,913 A | 1/1998 | Anderson et al. |
| 5,789,050 A | 8/1998 | Kang |
| 5,885,676 A | 3/1999 | Lobo et al. |
| 6,132,349 A | 10/2000 | Yokoyama |
| 6,210,037 B1 | 4/2001 | Brandon, Jr. |
| 6,412,325 B1 | 7/2002 | Croswell |
| 6,481,259 B1 | 11/2002 | Durney |
| 6,599,601 B2 | 7/2003 | Fogle et al. |
| 6,640,605 B2 | 11/2003 | Gitlin et al. |
| 6,643,561 B1 | 11/2003 | Torvinen |
| 6,658,316 B1 | 12/2003 | Mehta et al. |
| 6,877,349 B2 | 4/2005 | Durney et al. |
| 2001/0010167 A1 | 8/2001 | Leek |
| 2002/0184936 A1 | 12/2002 | Gitlin et al. |
| 2003/0037586 A1 | 2/2003 | Durney et al. |
| 2004/0134250 A1 | 7/2004 | Durney et al. |
| 2004/0206152 A1 | 10/2004 | Durney et al. |
| 2005/0005670 A1 | 1/2005 | Durney et al. |
| 2005/0061049 A1 | 3/2005 | Durney et al. |
| 2005/0064138 A1 | 3/2005 | Durney et al. |
| 2005/0097937 A1 | 5/2005 | Durney et al. |
| 2005/0126110 A1 | 6/2005 | Durney et al. |

FOREIGN PATENT DOCUMENTS

| | | |
|---|---|---|
| GB | 2 129 339 | 5/1984 |
| JP | 52-068848 | 6/1977 |
| JP | 53-070069 | 6/1978 |
| JP | 55-022468 A | 2/1980 |
| JP | 55-055222 U | 4/1980 |
| JP | 59-006116 U | 1/1984 |
| JP | 02-065416 U | 5/1990 |
| JP | 02-165817 A | 6/1990 |
| JP | 02-192821 A | 7/1990 |
| JP | 02-258116 A | 10/1990 |
| JP | 04-033723 A | 2/1992 |
| JP | 04-091822 A | 3/1992 |
| JP | 05-261442 A | 10/1993 |
| JP | 07-148528 A | 6/1995 |
| JP | 08-224619 A | 9/1996 |
| JP | 10-085837 A | 4/1998 |
| JP | 11-123458 A | 5/1999 |
| JP | 11-188426 A | 7/1999 |
| WO | WO 97/24221 A1 | 7/1997 |
| WO | WO 02/13991 A1 | 2/2002 |

OTHER PUBLICATIONS

Patent Abstracts of Japan, vol. 015, No. 006 (M-1066), Jan. 8, 1991 (JP 02-258116 A).

Publication "Office dA" by Contemporary World Architects, 2000, pp. 15, 20-35, Rockport Publishers, Inc., Gloucester, Massachusetts.

METHOD OF BENDING SHEET MATERIALS AND SHEET THEREFOR

BACKGROUND OF THE INVENTION

1. Field of the Invention

This invention relates, in general, to a method of folding sheet materials and a sheet therefor.

2. Description of Related Art

Currently, electronic equipment often includes several discrete circuit boards disposed in a three-dimensional configuration, that is, at an angle with respect to one another in order to fulfill limited space requirements. For example, electronic devices such as personal computers, stereo equipment, television sets and the like often have a first circuit board disposed on a base thereof, and a second circuit board disposed on a side wall thereof and generally mounted perpendicularly to the first circuit board. Such configuration requires relatively complex connection systems to interconnect the components of the first board with components of the second board.

Due to handling constraints, such connection systems are often not installed until the circuit boards have been assembled to a chassis of the electronic device or other internal frame pre-assembly. Furthermore, electrically testing the components is often difficult because the components are often not readily accessible once the boards have been installed in the respective electronic device. In the event that the boards include defective components, replacing the defective components is often difficult due to the limited accessibility, and may sometimes require disassembly.

What is needed is method of bending sheet materials which overcomes the above and other disadvantages. For example, it would be advantageous to replace the several circuit boards with a single circuit board that is capable of bending or folding, and in some cases, is capable of unfolding.

BRIEF SUMMARY OF THE INVENTION

In summary, one aspect of the present invention is directed to a sheet of material formed for bending along a bend line including a sheet of material having at least one dividing slit extending substantially along a desired bend line dividing the sheet of material into first and second planar regions, and at least two strap slits formed through the sheet of material intersecting the desired bend line, wherein the strap slits form a bending strap therebetween, the bending strap having a longitudinal strap axis intersecting the desired bend line.

Another aspect of the present invention is directed to a sheet of material formed for bending along a bend line including a sheet of material having a plurality of dividing slits extending substantially along a desired bend line dividing the sheet of material into first and second planar regions, and a plurality of substantially parallel strap slits formed through the sheet of material intersecting the desired bend line, wherein adjacent pairs of the strap slits form a bending strap therebetween, the bending strap having a longitudinal strap axis intersecting the desired bend line.

The sheet of material may be formed of a composite material. The composite material may be selected from the group consisting of polymer matrix composites, fiber reinforced composites, metal matrix composites, ceramic composites, and aggregate composites. The composite material may be, but not limited to, a fiber reinforced composite selected from the group consisting of fiberglass, polyaramid (Kevlar®), liquid crystal polymer, phenolic, and carbon fiber composites.

The sheet of material may include at least three dividing slits and at least a pair of strap sets, each strap set disposed between adjacent ones of the dividing slits, and each strap set having at least three strap slits forming at least two substantially parallel bending straps. Optionally, at least a pair of the strap sets are parallel to one another such that the strap axis of a first of the strap sets is parallel to the strap axis of a second of the strap sets. Alternatively, at least a pair of the strap sets are nonparallel to one another such that the strap axis of a first of the strap sets intersects the strap axis of a second of the strap sets. The strap sets may be symmetric about a transverse axis which extends substantially transverse to the desired bend line.

Each strap slit may have a substantially straight intermediate portion. Also, an end of at least one of the strap slits may include a enlarged stress-relieving end opening. Also, at least one of the strap slits may include a stress-relieving end radius to increase the cross-sectional area of an adjacent bending strap as the adjacent bending strap merges with a respective one of the planar regions. Optionally, the at least one of the strap slits and an adjacent dividing slit may be connected by the stress-relieving end radius. Furthermore, an adjacent pair of the strap slits may each include a stress-relieving end radius to increase the cross-sectional area of an adjacent bending strap as the adjacent bending strap meets a respective one of the planar regions. At least one dividing slit and an adjacent strap slit may be interconnected.

The strap axis may be oblique to the desired bend line. The strap axis may extend less than 45° with respect to the desired bend line. Alternatively, the strap axis may extend within the range of approximately 5-45° with respect to the desired bend line, an in the case that the strap are utilized as an in-plane actuator, approximately 5-60°. Further still, the strap axis may extend within the range of approximately 7-45° with respect to the desired bend line.

The sheet of material may have a substantially uniform thickness, and each bending strap may include a minimum width dimension that may be less than or substantially equal to the thickness of the sheet of material. At least one bending strap may include a continuous surface extending between the first and second planar regions. The sheet of material may include an electrical connector extending along the continuous surface between the first and second planar regions. Optionally, each of the first and second planar regions may include an assembly recess for locating and securing the sheet of material during assembly with another device.

Still another aspect of the present invention is directed to a method of forming a sheet of material for bending along a bend line including the steps of: forming at least one dividing slit through the sheet of material extending substantially along a desired bend line thereby dividing the sheet of material into first and second planar regions; and forming at least two strap slits through the sheet of material intersecting the desired bend line, thereby forming a bending strap between the strap slits, the bending strap having a longitudinal strap axis intersecting the desired bend line. The method may further include the step, after the forming steps but before the assembling step, mounting at least one component to at least one of the first and second planar regions.

Yet another aspect of the present invention is directed to a method of forming a sheet of material for bending along a bend line including the steps of: forming a plurality of dividing slits through the sheet of material extending substantially along a desired bend line thereby dividing the sheet of material into first and second planar regions; and forming a plurality of substantially parallel strap slits through the sheet of material intersecting the desired bend line, thereby forming a bending strap between adjacent pairs of the strap slits, the bending strap having a longitudinal strap axis intersecting the desired bend line.

The method may include, wherein prior to the forming steps, the step of selecting a sheet of elastically deformable material for slitting. The method may include, prior to the forming steps, selecting a sheet of composite material for slitting.

The forming steps may be accomplished simultaneously. The forming steps may be accomplished by forming at least three dividing slits and at least a pair of strap sets, and each strap set disposed between adjacent ones of the dividing slits, each strap set may have at least three strap slits forming at least two substantially parallel bending straps therebetween.

The strap-slits forming step may be accomplished by forming at least a pair of the strap sets parallel to one another such that the strap axis of a first of the strap sets is parallel to the strap axis of a second of the strap sets. The strap-slits forming step may be accomplished by forming at least a pair of the strap sets nonparallel to one another such that the strap axis of a first of the strap sets intersects the strap axis of a second of the strap sets. Furthermore, the strap-slits forming step may be accomplished by forming strap sets symmetrically about a transverse axis which extends substantially transverse to the desired bend line. The strap-slits forming step may be accomplished by forming each strap with a substantially straight intermediate portion.

The strap-slits forming step may be accomplished by forming an end of at least one of the strap slits with a enlarged stress-relieving end opening. The strap-slits forming step may be accomplished by forming at least one of the strap slits with a stress-relieving end radius to increase the cross-sectional area of an adjacent bending strap as the adjacent bending strap merges with a respective one of the planar regions. The strap-slits forming step may be accomplished by forming an adjacent pair of the strap slits each with a stress-relieving end radius to increase the cross-sectional area of an adjacent bending strap as the adjacent bending strap meets a respective one of the planar regions.

The forming steps may be accomplished by simultaneously forming the stress-relieving end radius to interconnect the at least one of the strap slits and an adjacent dividing slit. The forming steps may be accomplished by forming at least one interconnected dividing slit and adjacent strap slit.

The strap forming step may be accomplished by forming the strap slits such that the strap axis is oblique to the desired bend line.

The method may further include the step, prior to the forming steps, selecting a sheet of composite material having a substantially uniform thickness, wherein the strap-slit forming step may be accomplished by forming adjacent ones of the strap slits such that each bending strap may include a minimum width dimension that is less than or substantially equal to the thickness of the sheet of material. The method may further include the step of, after the forming steps, bending the sheet of material about the desired bend line. The method may further include the step of forming an assembly recess in each of the first and second planar regions for locating and securing the sheet of material during assembly. Furthermore, the method may include the steps of, after the forming steps, bending the sheet of material about the desired bend line, and assembling the sheet of material with another device such that a respective locating protrusion extends through each assembly recess. Further still, the method may further include the step of, after the forming steps but before the assembling step, mounting a component to at least one of the first and second planar regions.

The method of bending sheet materials and the sheets used therefor in accordance with the present invention have other features and advantages which will be apparent from or are set forth in more detail in the accompanying drawings, which are incorporated in and form a part of this specification, and the following Detailed Description of the Invention, which together serve to explain the principles of the present invention.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

The present invention is directed to relatively stiff sheet materials and methods of bending the same. For example, the present invention is particularly suited for fabricating electronic circuit boards, however, one will appreciate that the methods and sheet materials of the present invention are equally suited for other uses including, but not limited to in-plane springs and expansion joints, fiber optic devices, nanostructures, radiofrequency shields, wireless antennae and other devices.

As noted above, prior electronic devices often include several discrete circuit boards disposed in a three-dimensional configuration and require relatively complex connection systems to interconnect the components of a first board with components of a second board. The present invention overcomes the associated disadvantages of the multiple discrete circuit boards of the prior art, namely in that the present invention provides for a sheet of material that is capable of bending or folding and that is capable for serving as a single circuit board that replaces the multiple circuit boards of the prior art.

Such a foldable circuit board would save component count, system complexity, and space. As the components that are to be installed on the foldable circuit board may be installed and electrically connected before folding, and before the foldable circuit board is installed in an electronic device, the resulting circuit may be tested while it is still easily accessible to test equipment. Any defective components may be fixed or replaced at this stage, as such components would be readily accessible as the foldable circuit board has not yet been installed into the electronic device. Significantly, the above manufacturing, assembly and testing steps are simplified as they are performed on a substantially two-dimensional (2D) structure (e.g., a flat structure). The flat structure could be shipped flat for folding at a remote location. Later, the 2D structure can be folded into a three-dimensional (3D) structure (e.g., a folded structure) for more efficient space utilization or to allow the 3D structure to fit inside a specific volume.

Figure 1:
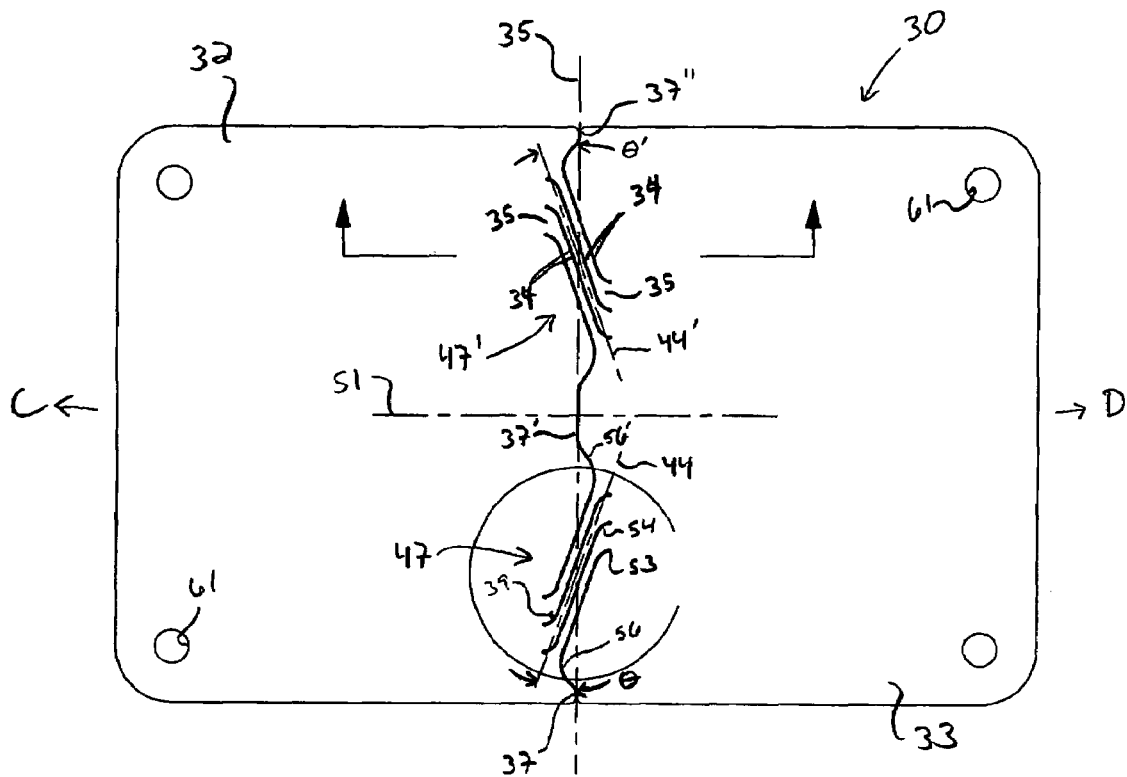
FIG. 1 is a top plane of a sheet material sheet in accordance with the present invention.
Figure 2:
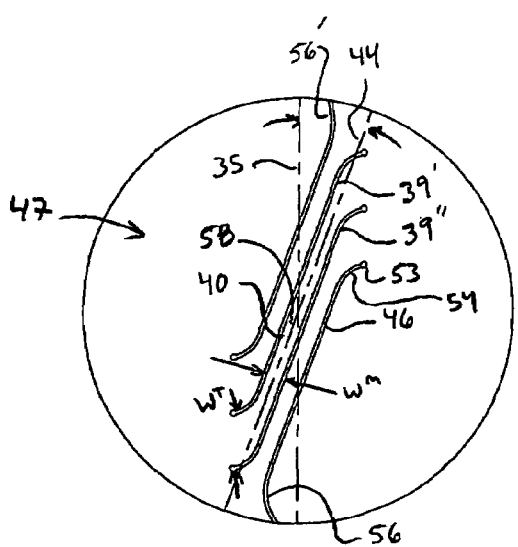
FIG. 2 is an enlarged detail of the sheet material of FIG. 1 taken within circle 2-2 of FIG. 1.

Turning now to the drawings, wherein like components are designated by like reference numerals throughout the various figures, a sheet of material, generally designated by the numeral 30 is illustrated in FIG. 1. Sheet 30 is configured such that, despite being formed of a relatively stiff material, first and second planar regions 32, 33 of the sheet may be bent about a bend line 35. To facilitate bending, sheet 30 is provided with a plurality of dividing slits 37, and with a plurality of strap slits 39 forming bending straps therebetween 40 as seen in FIG. 2.

Figure 9:
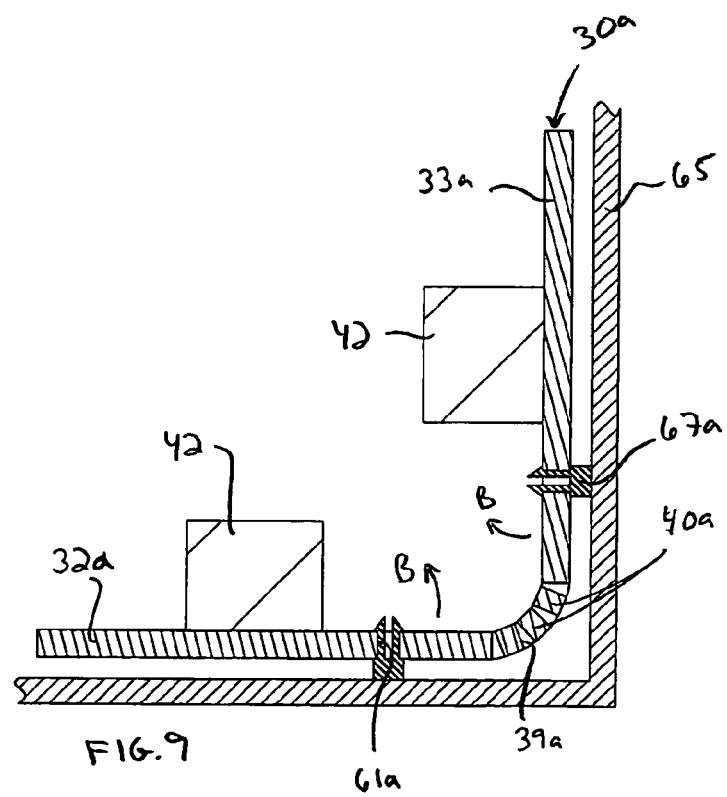
FIG. 9 is a cross-sectional view, similar to FIG. 5, of the sheet material of FIG. 1 shown installed within a chassis and having components installed thereon.

Such a bendable sheet is particularly suited for electronic circuit boards or other applications where multiple layers of board would be useful in that it would be possible to populate the boards with components (e.g., component 42; FIG. 9) while the boards are flat 2D structures and easily accessible using conventional equipment including, but not limited to, automated pick and place equipment, wave solder and other suitable manufacturing and assembly equipment. Once populated, the foldable boards can be folded to achieve more efficient packaging without the need for incorporating connectors or having to plug connectors into sockets, as would normally be the case.

In some aspect, the forming and bending of sheet materials in accordance with the present invention are similar to the methods and devices described in U.S. patent application Ser. No. 10/795,077 entitled SHEET MATERIAL WITH BEND CONTROLLING DISPLACEMENTS AND METHOD FOR FORMING THE SAME and now U.S. Pat. No. 7,152,450, U.S. patent application Ser. No. 10/672,766 entitled TECHNIQUES FOR DESIGNING AND MANUFACTURING PRECISION-FOLDED, HIGH STRENGTH, FATIGUE-RESISTANT STRUCTURES AND SHEET THEREFOR and now U.S. Pat. No. 7,152,449, U.S. patent application Ser. No. 10/256,870 entitled METHOD FOR PRECISION BENDING OF SHEET MATERIALS, SLIT SHEET AND FABRICATION PROCESS and now U.S. Pat. No. 6,877,349, and described in U.S. Pat. No. 6,481,259 entitled METHOD FOR PRECISION BENDING OF A SHEET OF MATERIAL AND SLIT SHEET THEREFOR, the entire contents of which applications and patent is incorporated herein by this reference. For example, the methods and devices used for forming slits described in the above applications and patent may be adapted to be used to form slits in accordance with the present invention.

One will appreciate, however, that some fold requirements of the present sheet materials vary from the fold requirements of the sheet materials described in the above-mentioned applications and patent. For example, the folds of sheet 30 need not snap into place and stay folded by themselves, The folds need not be load bearing, as the sheet, once installed in or on an electronic device as a circuit board, would be supported by the chassis or other framework of the electronic device. The folds need not provide geometrical precision so that the folded sections of the sheet line up with attachment points as necessary, as the sheet, once installed in an electronic device, would be positioned by the same means which supports the sheet in or on the electronic device.

In contrast, the fold configuration of the present sheet is conducive for use with relatively brittle sheet materials including, but not limited to, polymer matrix composites, fiber reinforced composites such as fiberglass, phenolic or carbon fiber composites, metal matrix composites (MMC), ceramic composites and aggregate composites (where the reinforcing phase consists of particles rather than fibers). Also the fold configuration of the present sheet is also conducive to reducing the folding force (i.e., force necessary to fold sheet 30 about bend line 35), especially as compared to folding a sheet of material not provided with the dividing and strap slits of the present invention.

One will appreciate that the folds of sheet 30 do provide various other features and advantages not found in prior fold configurations. For example, bending straps 40 provide continuity between the first and second planar regions of sheet 30, particularly in the unfolded state, so that the whole sheet can be handled as one piece.

Figure 5:
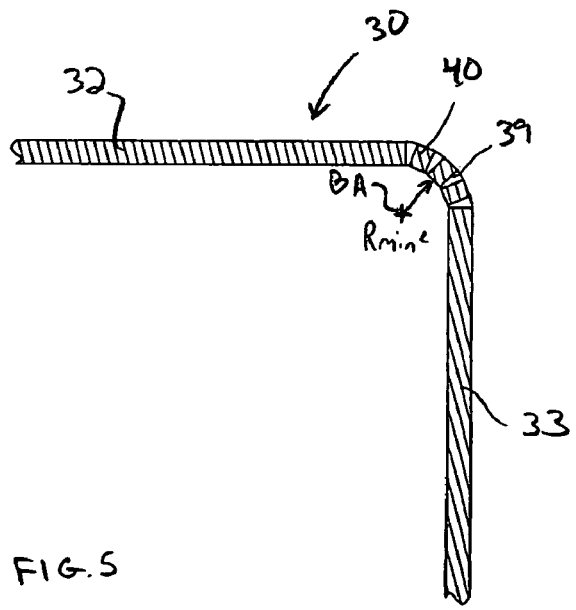
FIG. 5 is a cross-sectional view, similar to, FIG. 3 of the sheet material in the bent configuration of FIG. 4.

Turning now to the configuration of the sheet of material, sheet 30 includes a plurality of dividing slits 37 which extend substantially along a desired bend line 35, as shown in FIG. 1. Although the bend line appears to be coplanar or coincident with the sheet in FIG. 1, one will appreciate that the radius of curvature of the bent sheet will likely be greater than the thickness of the sheet, in which case the actual axis of about which the materials bend will likely be parallel to but offset from the sheet (see, e.g., bend axis BA in FIG. 5).

The dividing slits also divide the sheet of material into first and second planar regions 32, 33 on either side of the bend line (e.g., portions of sheet 29 which remain substantially flat). One will appreciate that two, three or more dividing slits may be utilized to divide the sheet into the first and second planar regions. One will also appreciate that dividing slits may extend along a plurality of bend lines in order to divide the sheet into three, four, five, six or more planar regions as desired (e.g., to form a triangular 3D structure, a square 3D structure, an open-box 3D structure, a closed-cube 3D structure, or other 3D structures).

Sheet 30 also includes a plurality of substantially parallel strap slits 39 formed therethrough. The strap slits intersect bend line 35 and adjacent pairs of the strap slits (e.g., 39', 39", see FIG. 2) form a bending strap 40 therebetween.

Preferably, the slits are formed by the use of computer numerically controlled (CNC) devices which control a slit forming apparatus, such as a laser, water jet, punch press, knife or other tool. One will appreciate that other suitable means may be used to form slits in accordance with the present invention including, but not limited to, casting and molding. As the configuration of all slits, dividing slits and strap slits, can be preprogrammed and effected at once on or at a single workstation, it is considered that the slits may be formed substantially simultaneously.

Returning now to the strap slits, each adjacent pair of strap slits 39 form a bending strap 40 therebetween. The bending strap has a longitudinal strap axis 44 intersecting the desired bend line as seen in FIG. 2.

Figure 3:
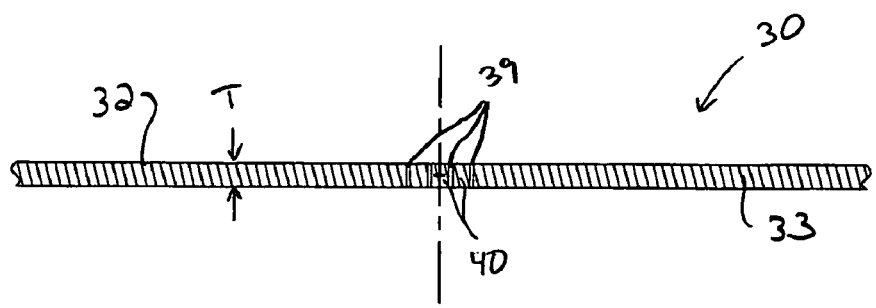
FIG. 3 is a cross-sectional view of sheet material of FIG. 1.

Preferably, each strap slit has substantially straight intermediate portion 46 which extends across the bend line. The intermediate portion provides a length of the strap slit which has a substantially uniform cross-section along which torsion (e.g., twist about the strap axis) may be distributed fairly uniformly along the length. In the illustrated embodiment, the sheet of material has a substantially uniform thickness (T) (see, e.g., FIG. 3), however, one will appreciate that the sheet need not be uniformly thick. Preferably, the bending strap may have a minimum width dimension ($w^m$) (see, FIG. 2) that is less than or substantially equal to the thickness (T) of the sheet of material in order to minimize the torsional resistance of the strap.

Preferably, the strap axis is oblique to the bend line. The strap axis may extend less than approximately 45° with respect to the desired bend line, more preferably, within the range of approximately 5-40° with respect to the desired bend line, and still more preferably within the range of approximately 15-30° with respect to the desired bend line. To this end, one will appreciate that a sheet of material may bend to a certain minimum radius of curvature before the sheet will fail. This minimum radius of curvature is dependent, among other things, on the material and thickness of the sheet. For example, a solid sheet of phenolic having a thickness of approximately 0.060 inches may have a minimum radius of curvature which the sheet can be bent about a bend line to a minimum radius of several inches, if not feet, beyond which minimum the phenolic sheet will fail.

Skewing the strap axis with respect to the bend line serves to reduce the effective minimum radius of curvature. Firstly, skewing the strap axis subjects the strap to a certain amount of torsion that is distributed along a length of the strap. The effective minimum of radius about the bend line may be reduced as a certain amount of angular displacement about the bend line is accommodated by such torsion. Furthermore, skewing the strap axis at an angle θ with respect to the fold line also skews the actual minimum radius of curvature ($Rmin^a$) angle θ with respect to the fold line. Thus, the effective minimum radius of curvature ($Rmin^e$) may be further reduced by the sine of angle θ thereby to reducing the radius of curvature as follows:

$$Rmin^e = Sin\ e(\theta) * Rmin^a$$

In the embodiment of FIG. 1, sheet 30 has three dividing slits 37, 37', 37" effectively separating the sheet into first and second planar regions 32, 33 on either side of bend line 35. A pair of strap sets 47, 49' are disposed between respective ones of the dividing slits. One will appreciate that two, three, four or more dividing slits may be utilized to form one, two, three or more straps sets.

In this embodiment, each strap set includes four strap slits 39 thereby forming three bending straps 40 as shown in FIG. 2 (only one bending strap 40 is shown). Again, one will appreciate that two, three, four or more strap slits may be utilized to respectively form one, two, three or more straps there between. Preferably, each strap set includes two or more straps in order to distribute torsion over a greater number of straps, and/or to accommodate a greater amount of torsion.

With continued reference to FIG. 1, the strap sets 47, 47' are not parallel to one another and are instead symmetrically arranged about a transverse axis 51 such that the strap axis 44 of the first strap set intersects the strap axis 44' of the second strap set. Such a symmetric arrangement is advantageous in that it tends to effectively cancel axial shifting of first planar region 32 relative to second planar region 33 along bend line 35.

Figure 6:
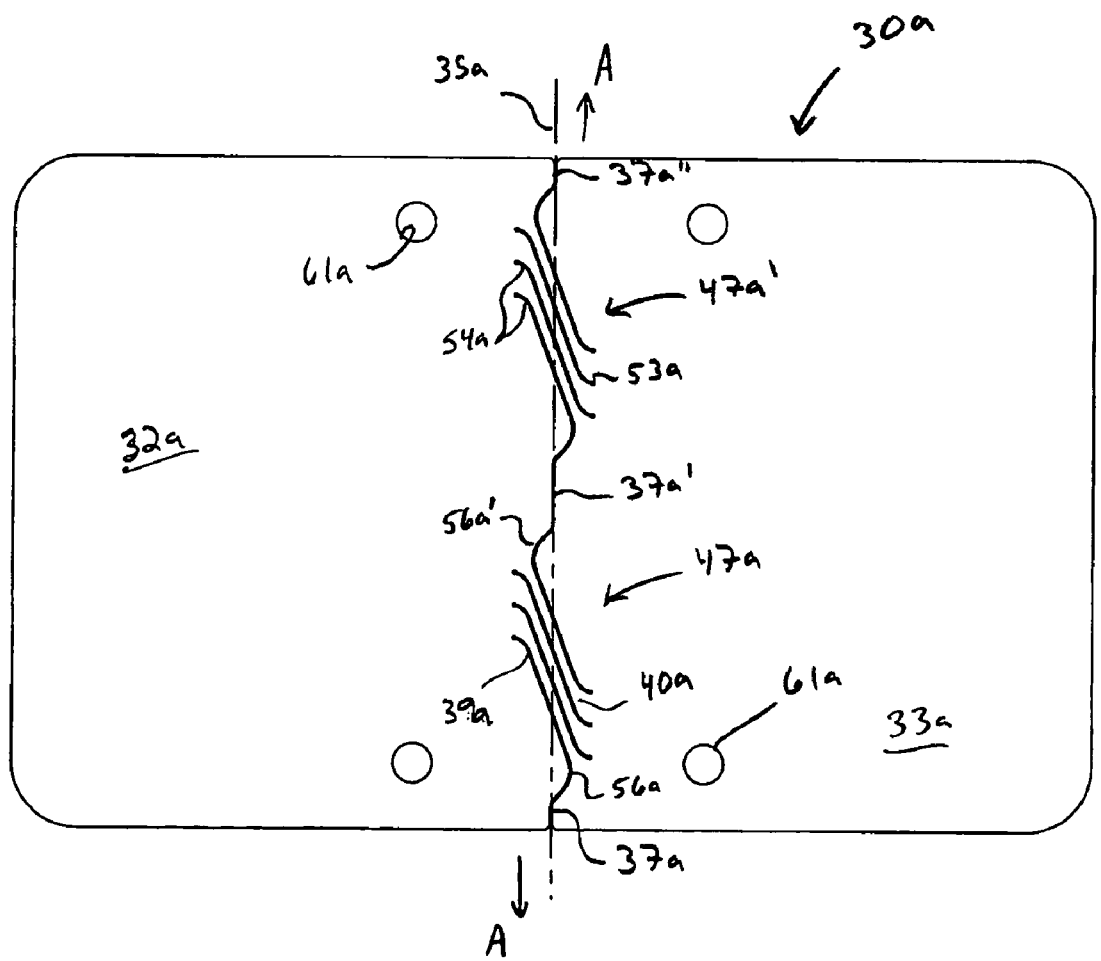
FIG. 6 is a top plane view of another sheet material similar to that shown in FIG. 1 but having a modified strap configuration.

One will appreciate that the strap sets may be asymmetrically oriented and even parallel to one another in the event that axial shift along the bend line is desired. For example, FIG. 6 illustrates a sheet 30a that includes a pair of strap sets 47a, 47a' that are parallel to one another. As will be apparent from FIG. 6, the geometric configuration of strap sets 47a, 47a' would allow a limited amount of axial shift of first planar region 32 relative to second planar region 33 as illustrated by arrows A, A' in FIG. 6.

Returning to FIG. 1, the strap slits 39 are provided with stress reducing structures at ends thereof, namely, enlarged stress-relieving end openings 53. The end openings are provided so as to effect a reduction in the stress concentration in the bending straps. The end openings will tend to cause any stress cracks to propagate back into the strap slits, depending on the loading direction of the sheet. It will be understood, however, that stress reducing structures, such as the enlarged end openings are not required for realization of the benefits of the bending method of the present invention. In the illustrated embodiment, the end openings have a circular configuration having a diameter that is larger than the width or kerf of the strap slits, as best seen in FIG. 2.

The strap slits may also be provided with other stress-reducing structures. For example, the strap slits may be provided with stress-relieving end radii 54 which cause the ends of the strap slits to diverge away from bend line 35. In particular, each end radius diverges away from the bend line and thus gradually increases the width and cross-sectional area of an adjacent bending strap as the strap meets or merges with a respective planar region. As best seen in FIG. 2, the terminal width dimension ($w^t$) of each bending strap is significantly larger than the minimum width dimension $w^m$. For example, the terminal width may be two, three, or more, times larger than the minimum width dimension of the strap. Moreover, larger terminal width dimension may cause the deformation of bending straps to be more gradual during bending and torsion so that stress concentration will be reduced. This, of course, combines with increasing strap width to transfer loading forces and bending forces more evenly into the remainder of the sheet with lower stress concentration As illustrated in FIG. 1, adjacent ones of dividing slits 37 and strap slits 39 may be interconnected end-to-end with a stress reducing structure such as connecting radius 56. One will appreciate that the dividing slits may extend to and terminate intersecting a respective strap slit, however, connecting radius 56 provides several advantages.

Firstly, interconnecting adjacent dividing slits and strap slits end-to-end simplifies the manufacturing process. For example, in the event that the slits are formed by the use of computer numerically controlled (CNC) devices which control a slit forming apparatus, such as a laser, water jet, punch press, knife or other tool, the end-to-end configuration eliminates the need to power down and/or remove the cutting element from the sheet between the steps of forming a dividing slit and an adjacent strap slit. Similarly, since the dividing slit and adjacent strap slit form one continuous slit, there is no need to reverse or backtrack the tool to complete the strap slit.

Secondly, connecting radius 56 eliminates the sharp point which would otherwise be formed if the dividing slit linearly continued to intersect the adjacent strap slit, namely, the sharp point that would be formed on the acute-angle side of such intersection.

The materials being considered in the present invention are capable of elastic deformation without failure but may fail catastrophically when a substantial amount of plastic deformation occurs. Consequently, the torsion straps are designed to maintain the materials in a state of substantially elastic-only deformation. The substantially elastic-only torsion straps can be considered torsion springs. Each strap contributes a finite amount of resistance force as the two planes are rotated about the bend. Three-dimensional structures can be held into position by the fastening or closure methods that prevent the rotational degrees of freedom of each bend from springing open. Printed circuits boards that incorporate the torsion joints of the present invention can be held closed in the desired bend angle by the temporary or permanent docking of components that are assembled onto the surface of each plane.

These elastic bend joints can be designed with a large degree of spring-back force if the bend joint will be subject to mechanical stresses in service or conversely the joints may be designed with a negligible amount of spring-back force if a surrounding chassis supports the folded structure. Another consideration in the design choice of how stiff to make the elastic bend joint is the ability to handle the unfolded sheet in a planar form prior to and after assembly of attached components but prior to folding. A very low force elastic bend joint with negligible spring-back force may be unable to resist the gravitational forces of the slit sheet itself or in combination with the attached components. Therefore, a sheet may be designed with additional rigidity at each elastic bend joint which must be overcome by fastening to a supporting chassis, through temporary or permanent docking of components attached to the surface of each articulated plane, through three dimensional closure of three or more planes, or through compression or tensile members that temporarily or permanently define the angular degree of freedom of the elastic bend joint. At least one bending strap may include a continuous surface 58, that is, an uninterrupted surface extending between the first and second planar regions as shown in FIG. 2. As the continuous surface extends obliquely to the bending line, and as the continuous surface is not subject to creasing as sheet 30 is folded about bend line 35, the continuous surface provides a path upon which an electrical connector 60 may be located between the first and second planar regions. The electrical connector may take the form of a portion of a printed circuit connector or otherwise applied directly to the surface of the sheet. One will appreciate that other suitable electrical conduit means may be applied directly to the sheet such that the conduit means extends along the continuous surface.

For example, the electrical connection may make use of conductive electrical traces that pass between the first and second planar regions along one or more straps, occurring on one or more layers of a multi-layer printed circuit board. The purpose of these conductive electrical traces running along the straps can be the provision of power from one planar region to another. Another purpose for these conductive electrical traces is the communication of electrical signals or logic switching from one planar region to another. Yet another purpose for providing conductive electrical traces across articulated elastic bend joints is electrical or capacitive continuity between ground plane structures which provide, among other things, electromagnetic shielding.

Because the process of forming the electrically conductive traces is separate from the process of forming the strap-defining slits, provisions must be made for registering the two fabrication steps in close registration. If the automated process for forming the boards and slitting them is inline, connected, and maintains rotational and translated position of the board throughout the process, then co-registration of the two processes will be automatically embedded in the manufacturing process. However, if the position of the board is not maintained between the trace-forming steps and the slitting steps, for example because the two processing steps are in different locations, the design of the printed circuit board most preferably contains registration marks that can be use by the slit forming process to recall the positional registration of the board prior to slitting.

Figure 4:
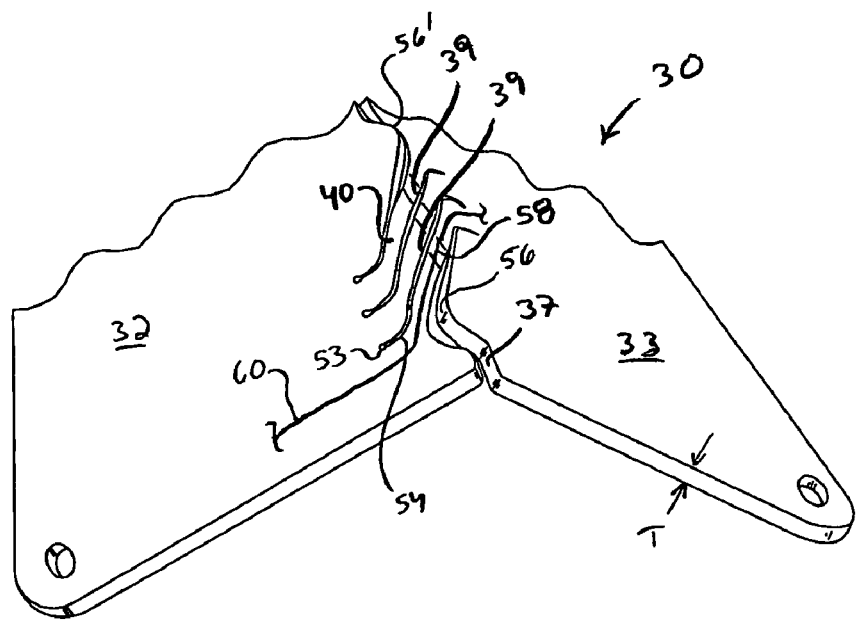
FIG. 4 is a perspective view of the sheet material of FIG. 1 in a bent configuration.

One will appreciate that the foldable configuration of sheet 30 allows the sheet to be populated with one or more components 42 while the sheet is in its flat configuration. In the event that the components are electronic and located on opposing planar regions, electrical connector 60, shown in FIG. 4, may be used to operably connect the components.

Optionally, each of the first and second planar regions are provided with one or more assembly recesses 61 for locating and securing the sheet of material during assembly with another device. In one embodiment, the assembly recess takes the form of a plurality of assembly apertures 61 located adjacent the corners of sheet 30. One will appreciate that one, two, three or more assembly recesses may be used and that the locations of the assembly recesses may vary depending upon various design parameters including, but not limited to, the arrangement of components populated on the sheet, whether the sheet is installed on and about a subassembly 63 or other suitable device in an external-corner configuration (see FIG. 8), whether the sheet is installed within a chassis 65 or other suitable device in an internal-corner configuration (see FIG. 9), and/or the inherent spring coefficient of the sheet of material. For example, if the sheet of material has a relatively high spring coefficient which tends to return the sheet to its flat configuration when bent, the assembly recesses may be more numerous and provided closer or further to the bend line to maximize leverage in holding sheet in place.

Figure 8:
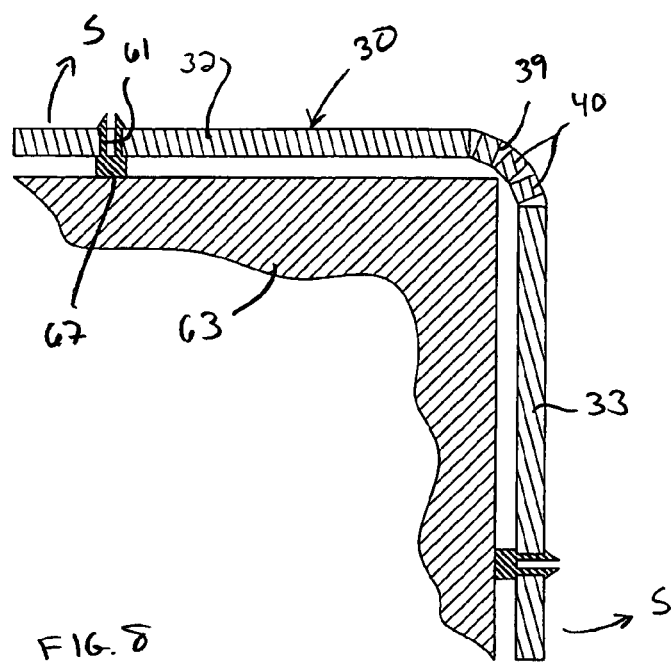
FIG. 8 is a cross-sectional view, similar to FIG. 5, of the sheet material of FIG. 1 shown installed about a component.

For example, in the case of an external-corner configuration, the sheet may include one or more assembly apertures 61 located proximal the corners thereof to cooperate with assembly fastener 67 in order to minimize the likelihood of the outer extremities of first and second planar regions 32, 33 from springing back away from subassembly 63 such that sheet 30 returns to its flat configuration, as illustrated by Arrow S in FIG. 8. Similarly, in the case of an internal-corner configuration, assembly apertures 61a may be located proximal the bend line to cooperate with assembly fastener 68a in order to minimize the likelihood of the inner extremities of first and second planar regions 32a, 33a from buckling up away from the internal corner of chassis 65 such that sheet 30 returns to its flat configuration, as illustrated by Arrow B in FIG. 9.

The various embodiments of the present invention allow designing manufacturing and fabrication advantages to be achieved which have not heretofore been realized. Thus, the full benefits of such design and fabrication techniques as CAD design, Rapid Prototyping and "pick and place" assembly can be realized by using single 2D sheets of material to replace 3D structures which heretofore required the use of multiple discrete 2D structures.

The configuration of the bendable sheet of the present invention may also be suitable for manufacturing circuit boards which conform to non-orthogonal device packages. Generally, industrial designs are often limited by the need for flat or connectored printed circuit board assemblies ("PCBA's"). The bendable configuration of sheet 30 would facilitate artistically shaped devices having compact designs with high circuit density. For example, wearable electronics, conformal automotive or airborne electronics and other products may require complex-shaped housings that require circuit boards to be oblique to one another. The configuration of the present invention would allow a single circuit board take the place of two or more obliquely oriented circuit boards.

Furthermore, the bendable configuration of the sheet may be utilized to provide a hinged PCBA, that is, a PCBA that may be bent back and forth repeatedly. For example, the sheet of the present invention may be adapted for use within a folding mobile phone or other device which presently requires two or more circuit boards that must pivot relative to one another. Such a bendable configuration avoids the need for inelegant hot bar soldering and/or expensive connectors between two discrete circuit boards.

Another advantage of the present invention is that one may be able to fold a circuit board into its own RF shield and isolate RF circuits from digital circuits cleanly and cheaply. The device could be tested flat to verify functionality and repair any defective or missing components without removing RF cans prior to folding.

An advantage of the interconnected straps is the bendable sheet of the present invention may also be used with fiber optic technologies. For example, an embedded light pipe may extend along one or more straps to optically couple the first and second planar regions of the sheet. Such embedded light pipes would be capable of transferring optic signals between the first and second planar regions without having to resort to optical fibers and their high cost.

One will appreciate that the geometries of the sheet of the present invention may also be utilized on nanostructures in order to produce articulated micro-mirrors, biomimetic cilia, piezoelectric drive motors and other nanotechnology devices.

One will also appreciate that the configuration of the sheet material may also serve as an in-plane spring which allows linear displacement of the first and second planar regions with respect to one another. For example, the slit/strap configuration of sheet 30 would allow first planar region 32 to displace in the direction of arrow C (FIG. 1) relative to second planar region 33 and/or the second planar region to displace in the direction of arrow D (FIG. 1) relative to the first planar region to displace in the direction of arrow D. Such a configuration allows the sheet to accommodate expansion and contraction of materials for various reasons including, but not limited to, heat. Furthermore, the configuration of sheet 30 allows the material to absorb a significant amount of linear force (e.g., in the direction of arrows C and D) with relatively little linear displacement. Such a configuration may be utilized in the manufacture of strain gauges and other devices. Additionally, the spaces created by the slit forming process may be filled with viscoelastic material to act as an inherent vibration dampener for the in-plane spring of the present invention.

Figure 7:
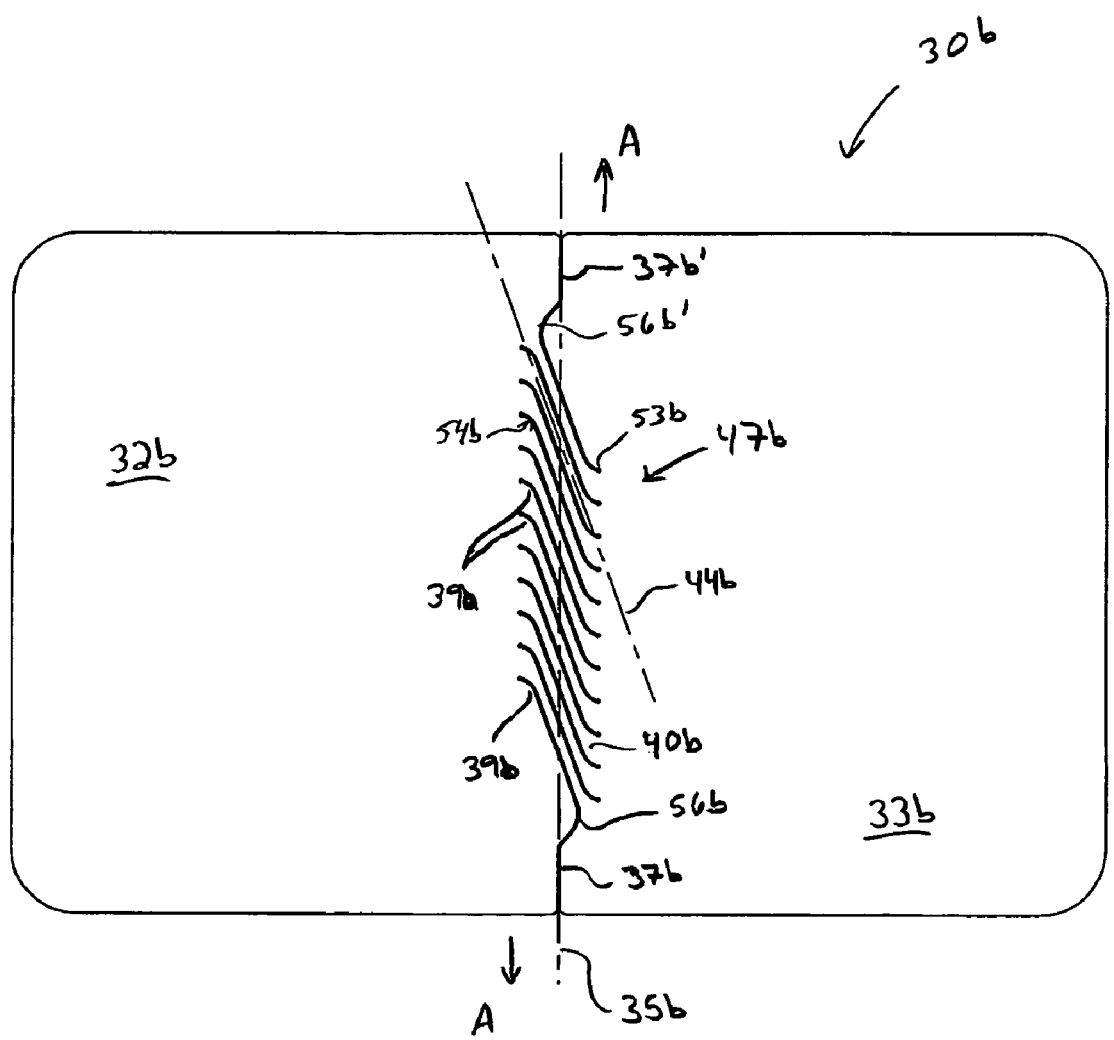
FIG. 7 is a top plane view of another sheet material similar to that shown in FIG. 1 but having a modified strap configuration.

In another embodiment of the present invention, sheet of material 30a is similar to sheet 30 described above but includes parallel strap sets 47a as shown in FIG. 6. In yet another embodiment of the present invention, sheet of material 30b is similar to sheets 30 and 30a described above but includes a single strap set 47b including eleven bending straps 40 as shown in FIG. 7. Like reference numerals have been used to describe like components of sheets 30, 30a and 30b. In operation and use, sheets 30a and 30b are used in substantially the same manner as sheet 30 discussed above.

One will appreciate that the number and configuration of strap sets may vary in accordance with the present invention. For example, each strap set may be parallel with one another, symmetrically arranged, asymmetrically, arranged and so forth. Similarly, each strap set may have one, two, three or more bending straps contained therein.

For convenience in explanation and accurate definition in the appended claims, the terms "up" or "upper", "down" or "lower", "inside" and "outside" are used to describe features of the present invention with reference to the positions of such features as displayed in the figures.

In many respects the modifications of the various figures resemble those of preceding modifications and the same reference numerals followed by subscripts "a" and "b" designate corresponding parts.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A sheet of material formed for bending along a bend line comprising:
   a sheet of material having a plurality of dividing slits extending substantially along a desired bend line dividing said sheet of material into first and second planar regions, and a plurality of substantially parallel strap slits formed through said sheet of material intersecting said desired bend line, wherein said strap slits form a plurality of bending straps between an adjacent pair of dividing slits, said bending straps having a longitudinal strap axis intersecting said desired bend line.

2. The sheet of material of claim 1, wherein said sheet of material is formed of a composite material.

3. The sheet of material of claim 2, wherein said composite material is selected from the group consisting of polymer matrix composites, fiber reinforced composites, metal matrix composites, ceramic composites, and aggregate composites.

4. The sheet of material of claim 3, wherein said composite material is a fiber reinforced composite selected from the group consisting of fiberglass, phenolic, and carbon fiber composites.

5. The sheet of material of claim 1, wherein said sheet of material includes at least three dividing slits and at least a pair of strap sets, each scrap set disposed between adjacent ones of said dividing slits, and each strap set having at least two strap slits forming at least one substantially parallel bonding straps.

6. The sheet of material of claim 5, wherein at least a pair of said strap sets are parallel to one another such that the strap axis of a first of said strap sets is parallel to the strap axis of a second of said strap sets.

7. The sheet of material of claim 5, wherein at least a pair of said strap sets are nonparallel to one another such that the strap axis of a first of said strap sets intersects the strap axis of a second of said strap sets.

8. The sheet of material of claim 7, wherein said strap sets are symmetric about a transverse axis which extends substantially transverse to said desired bend line.

9. The sheet of material of claim 1, wherein each said strap slit has a substantially straight intermediate portion.

10. The sheet of material of claim 1, wherein an end of at least one of said strap slits includes a enlarged stress-relieving end opening.

11. The sheet of material of claim 10, wherein at least one of said strap slits includes a stress-relieving end radius to increase the cross-sectional area of an adjacent bending strap as said adjacent bending strap merges with a respective one of said planar regions.

12. The sheet of material of claim 11, wherein said it least one of said strap slits and an adjacent dividing slit is connected by said stress-relieving end radius.

13. The sheet of material of claim 1, wherein an adjacent pair of said strap slits each includes a stress-relieving end radius to increase the cross-sectional area of an adjacent bending strap as said adjacent bending swap meets a respective one of said planar regions.

14. The sheet of material of claim 1, wherein at least one dividing slit and an adjacent strap slit are interconnected.

15. The sheet of material of claim 1, wherein said strap axis is oblique to said desired bend line.

16. The sheet of material of claim 1, wherein said strap axis extends less than 45° with respect to said desired bend line.

17. The sheet of material of claim 16, wherein said strap axis extends within the range of approximately 5-40° with respect to said desired bend line.

18. The sheet of material of claim 16, wherein said strap axis extends within the range of approximately 15-30° with respect to said desired bend line.

19. The sheet of material of claim 1, wherein said sheet of material has a substantially uniform thickness, and each said bending strap includes a minimum width dimension that is less than or substantially equal to the thickness of said sheet of material.

20. The sheet of material of claim 1, whereby at least one bending strap includes a continuous surface extending between said first and second plater regions.

21. The sheet of material of claim 20, said sheet of material further comprising an electrical connector extending along said continuous surface between said first and second planar regions.

22. The sheet of material of claim 1, wherein each of said first and second planar regions includes an assembly recess for locating and securing said sheet of material during assembly with another device.

* * * * *